(12) United States Patent
Zhao et al.

(10) Patent No.: US 10,115,701 B2
(45) Date of Patent: Oct. 30, 2018

(54) SEMICONDUCTOR DEVICE AND METHOD OF FORMING CONDUCTIVE VIAS BY BACKSIDE VIA REVEAL WITH CMP

(71) Applicant: STATS ChipPAC, Ltd., Singapore (SG)

(72) Inventors: Xing Zhao, Singapore (SG); Duk Ju Na, Singapore (SG); Siew Joo Tan, Singapore (SG); Pandi C. Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 504 days.

(21) Appl. No.: 14/316,561

(22) Filed: Jun. 26, 2014

(65) Prior Publication Data

US 2015/0380339 A1    Dec. 31, 2015

(51) Int. Cl.
*H01L 25/065* (2006.01)
*H01L 23/00* (2006.01)
(Continued)

(52) U.S. Cl.
CPC .... *H01L 25/0657* (2013.01); *H01L 21/76898* (2013.01); *H01L 21/78* (2013.01); *H01L 24/03* (2013.01); *H01L 24/94* (2013.01); *H01L 25/50* (2013.01); *H01L 2224/03002* (2013.01); *H01L 2224/0401* (2013.01);
(Continued)

(58) Field of Classification Search
CPC ..... H01L 25/0657; H01L 24/94; H01L 24/03; H01L 25/50; H01L 21/78; H01L 21/76898; H01L 2924/13091; H01L 2224/03002; H01L 2225/06565; H01L 2225/06513; H01L 2224/94; H01L 2224/13025; H01L 2224/06181; H01L 2224/0557; H01L 2224/0401; H01L 2224/16145; H01L 2225/06541
See application file for complete search history.

(56) References Cited

U.S. PATENT DOCUMENTS 8,263,497 B2    9/2012 Andry et al.
8,659,162 B2    2/2014 Suthiwongsunthorn
(Continued)

*Primary Examiner* — Steven Loke
*Assistant Examiner* — Juanita Rhodes
(74) *Attorney, Agent, or Firm* — Robert D. Atkins; Atkins and Associates, P.C.

(57) ABSTRACT

A semiconductor device has a semiconductor wafer and a conductive via formed through the semiconductor wafer. A portion of the semiconductor wafer is removed such that a portion of the conductive via extends above the semiconductor wafer. A first insulating layer is formed over the conductive via and semiconductor wafer. A second insulating layer is formed over the first insulating layer. The first insulating layer includes an inorganic material and the second insulating layer includes an organic material. A portion of the first and second insulating layers is removed simultaneously from over the conductive via by chemical mechanical polishing (CMP). Alternatively, a first insulating layer including an organic material is formed over the conductive via and semiconductor wafer. A portion of the first insulating layer is removed by CMP. A conductive layer is formed over the conductive via and first insulating layer. The conductive layer is substantially planar.

18 Claims, 16 Drawing Sheets

(51) Int. Cl.
    *H01L 21/78*    (2006.01)
    *H01L 21/768*   (2006.01)
    *H01L 25/00*    (2006.01)

(52) U.S. Cl.
    CPC ............... *H01L 2224/0557* (2013.01); *H01L 2224/06181* (2013.01); *H01L 2224/13025* (2013.01); *H01L 2224/16145* (2013.01); *H01L 2224/94* (2013.01); *H01L 2225/06513* (2013.01); *H01L 2225/06541* (2013.01); *H01L 2225/06565* (2013.01); *H01L 2924/13091* (2013.01)

(56) References Cited

U.S. PATENT DOCUMENTS

| | | | |
|---|---|---|---|
| 2008/0113505 A1* | 5/2008 | Sparks | H01L 21/76898 438/637 |
| 2011/0056740 A1* | 3/2011 | Takano | H01L 21/486 174/262 |
| 2013/0147036 A1* | 6/2013 | Choi | H01L 21/76898 257/737 |
| 2013/0147055 A1* | 6/2013 | Na | H01L 21/561 257/774 |
| 2013/0221493 A1 | 8/2013 | Kim et al. | |
| 2013/0252416 A1 | 9/2013 | Takeda et al. | |
| 2014/0008802 A1 | 1/2014 | Yang et al. | |
| 2014/0151895 A1* | 6/2014 | West | H01L 23/481 257/774 |
| 2015/0123278 A1* | 5/2015 | Park | H01L 21/76898 257/751 |
| 2015/0279798 A1* | 10/2015 | Park | H01L 24/14 257/737 |

\* cited by examiner

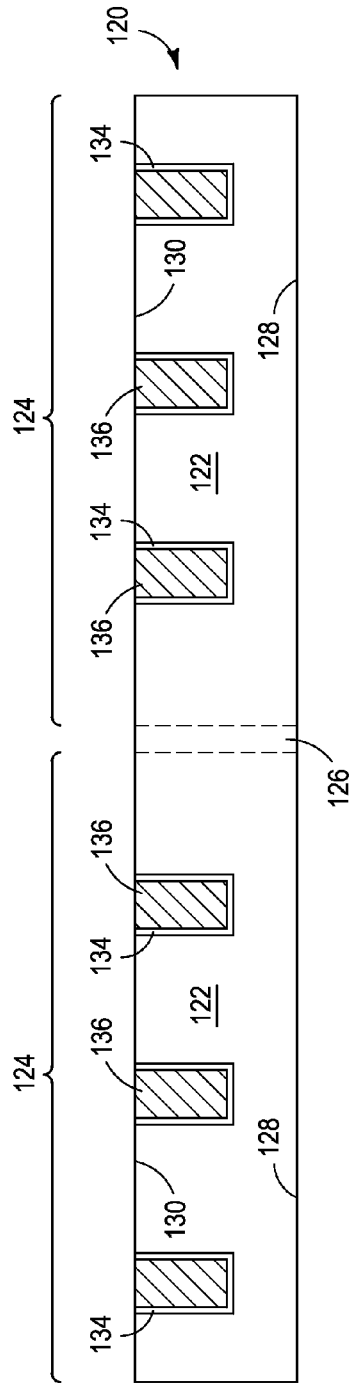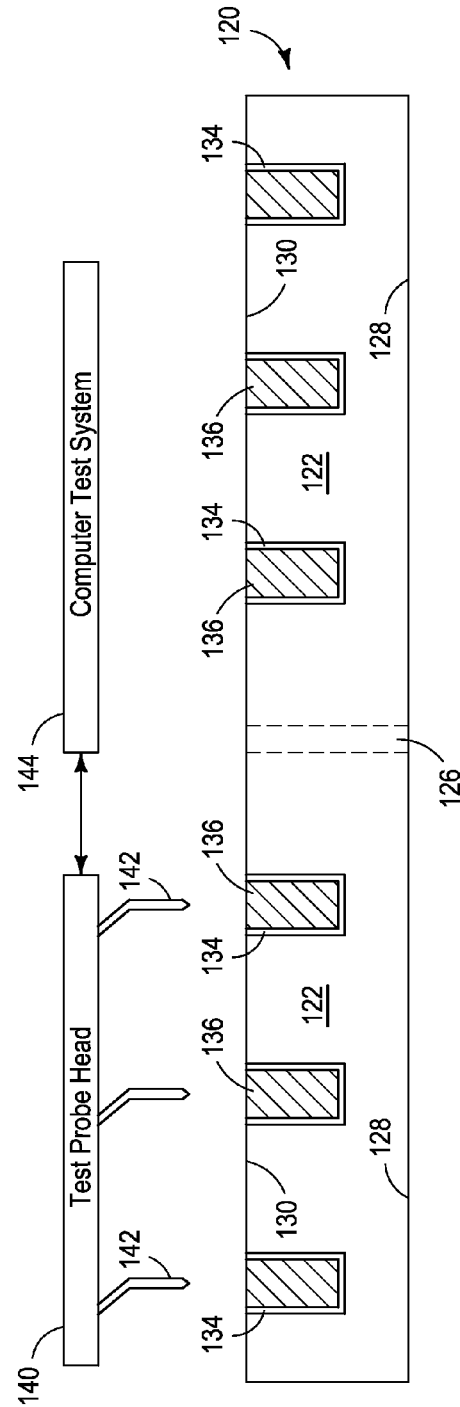

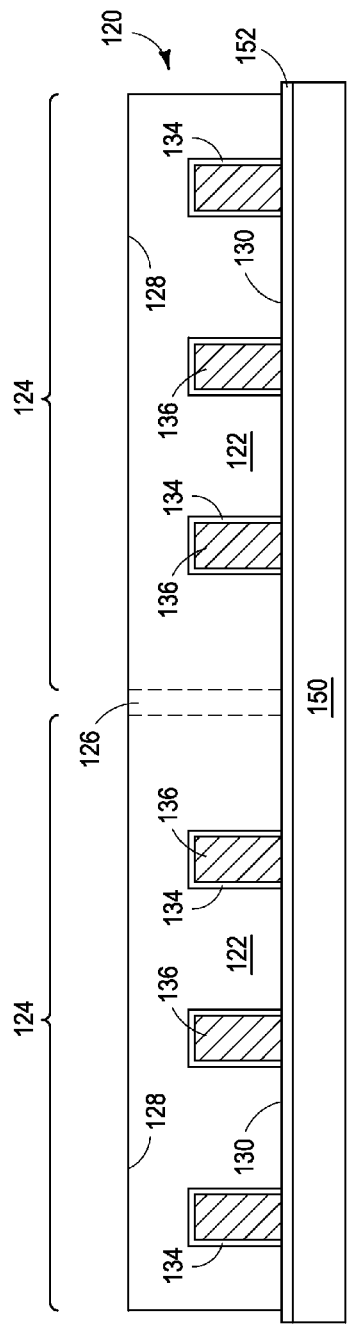
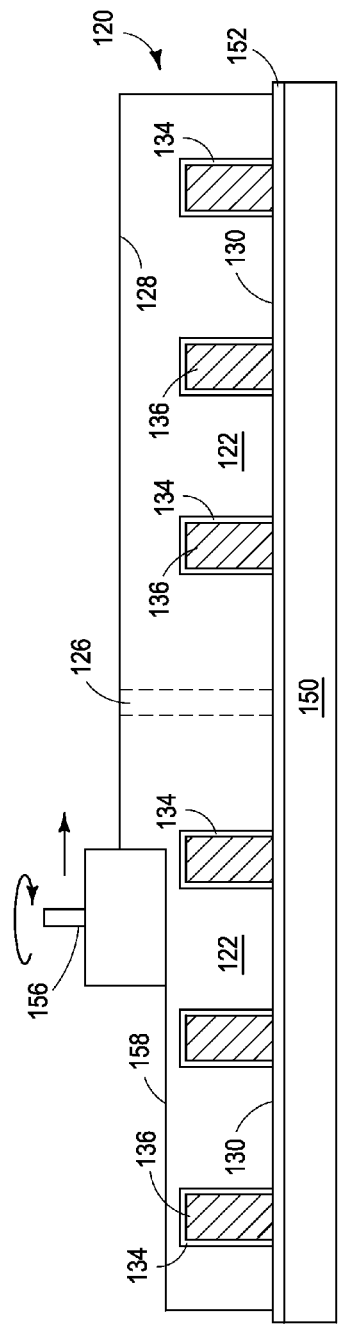
FIG. 3a
FIG. 3b

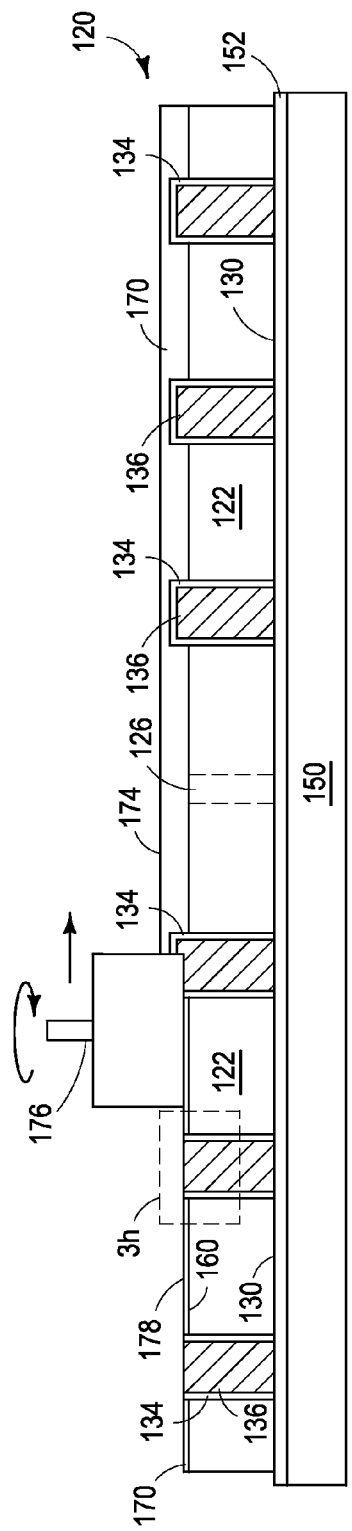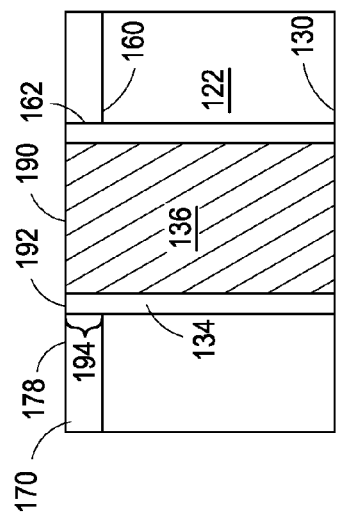
FIG. 3g
FIG. 3h

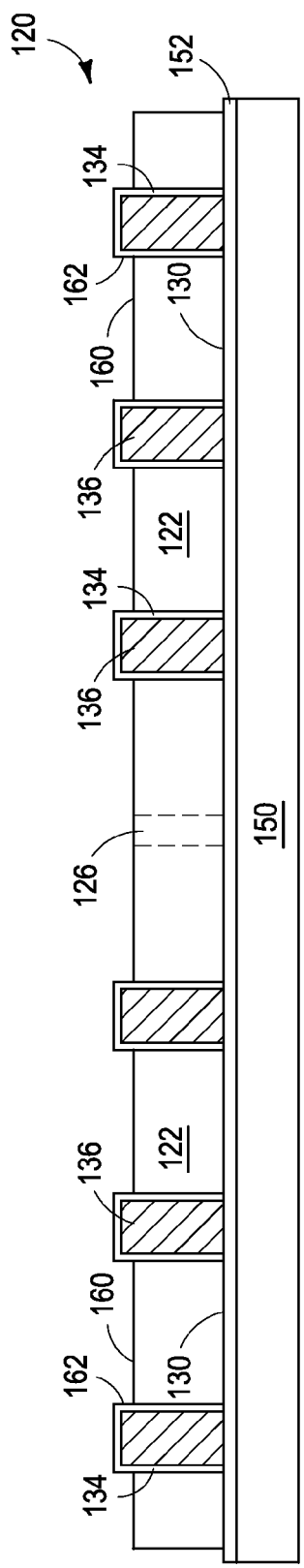

SEMICONDUCTOR DEVICE AND METHOD OF FORMING CONDUCTIVE VIAS BY BACKSIDE VIA REVEAL WITH CMP

FIELD OF THE INVENTION

The present invention relates in general to semiconductor devices and, more particularly, to a semiconductor device and method of forming conductive vias using a backside via reveal process with chemical mechanical polishing (CMP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through-silicon vias (TSV). TSV provide vertical electrical connection through semiconductor die in three-dimensional (3D) integration of semiconductor packaging. A plurality of vias is formed through the semiconductor wafer. The vias are filled with conductive material to form the conductive TSV. Conductive TSV formed partially through a semiconductor wafer are revealed by removing a portion of the semiconductor material using a backside via reveal (BVR) process. Current BVR processes involve multiple processing steps including chemical mechanical polishing (CMP), silicon etching, multiple passivation processes, photolithography, and passivation etching. The passivation layers are subject to stress after assembly of the semiconductor package. Inorganic passivation layers are particularly susceptible to damage, such as cracking or breakage, due to thermal stress. Further, photolithography is an expensive manufacturing process used for removing insulating layers. Multiple photolithography and etching steps increase the cost of the semiconductor device. Thus, current BVR processes are not economical for mass production of semiconductor devices.

SUMMARY OF THE INVENTION

A need exists for a cost effective method of forming and revealing conductive vias to avoid the shortcomings of the steps involved in photolithography. Accordingly, in one embodiment, the present invention is a method of making a semiconductor device comprising the steps of providing a semiconductor wafer, forming a conductive via through the semiconductor wafer, and removing a portion of the semiconductor wafer. A portion of the conductive via extends above the semiconductor wafer. The method further includes the steps of forming a first insulating layer over the conductive via and semiconductor wafer, removing a portion of the first insulating layer from over the conductive via, and forming a conductive layer including a planar surface over the conductive via and first insulating layer.

In another embodiment, the present invention is a method of making a semiconductor device comprising the steps of providing a semiconductor wafer, forming a conductive via into the semiconductor wafer, forming a first insulating layer over the semiconductor wafer and conductive via, and forming a conductive layer including a planar surface over the conductive via and first insulating layer.

In another embodiment, the present invention is a method of making a semiconductor device comprising the steps of providing a semiconductor die, forming a conductive via through the semiconductor die, removing a portion of the semiconductor die, forming a first insulating layer over the conductive via and semiconductor die, and removing a portion of the first insulating layer from over the conductive via.

In another embodiment, the present invention is a semiconductor device comprising a semiconductor die and a conductive via formed through the semiconductor die. A first insulating layer is formed over the semiconductor die and around the conductive via. A conductive layer is formed over the conductive via. The conductive layer is substantially planar.

BRIEF DESCRIPTION OF THE DRAWINGS

FIGS. 2a-2f illustrate a semiconductor wafer with a plurality of semiconductor die separated by a saw street;

FIGS. 3a-3m illustrate a method of forming a semiconductor wafer including conductive vias by backside via reveal with organic passivation; and FIGS. 4a-4l illustrate a method of forming a semiconductor wafer including conductive vias by backside via reveal with organic and inorganic passivation.

DETAILED DESCRIPTION OF THE DRAWINGS

Figure 1:
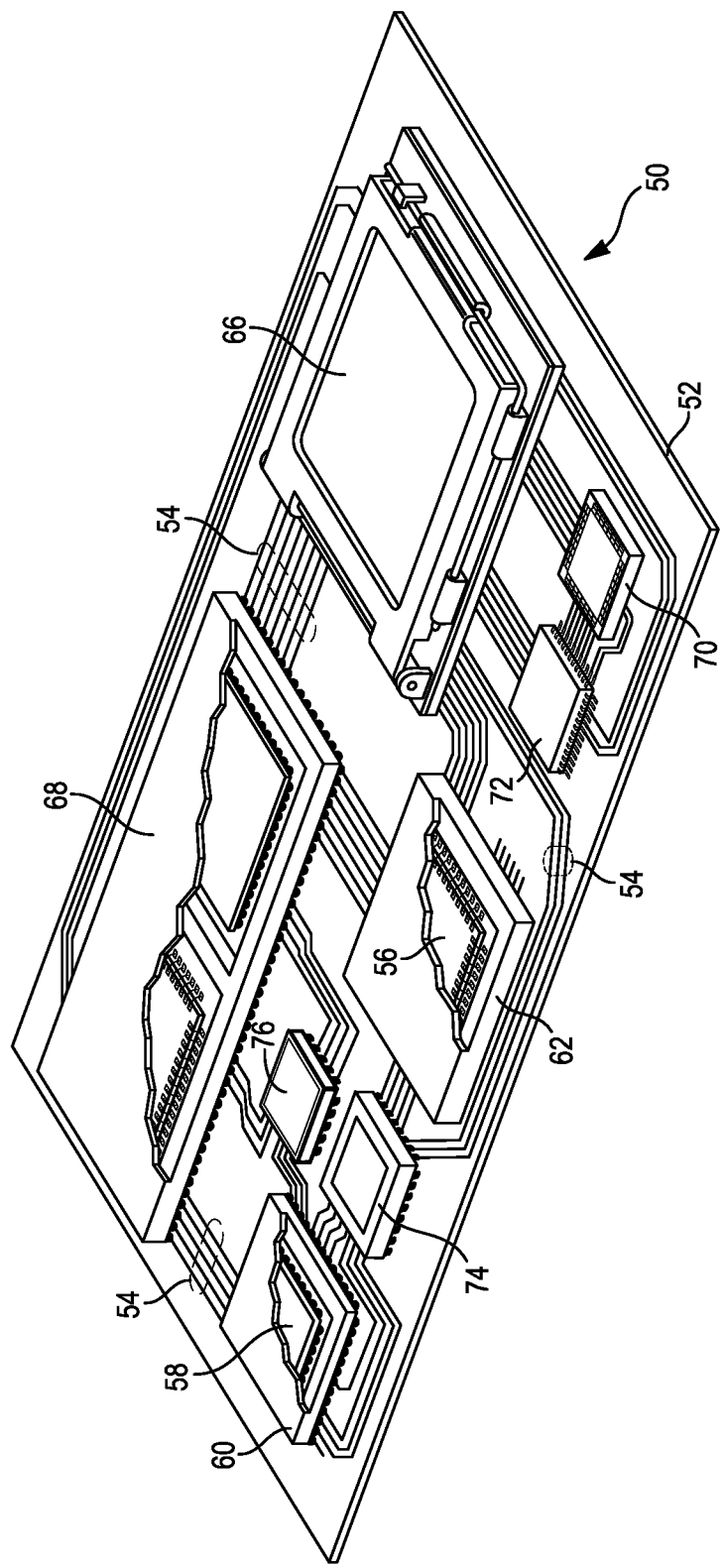
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
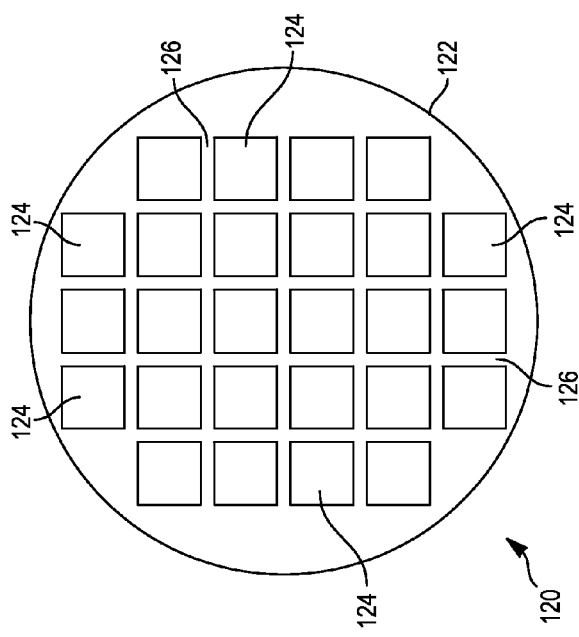

FIGS. 2a-2f illustrate, in relation to FIG. 1, a process of forming conductive vias through a semiconductor wafer. FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
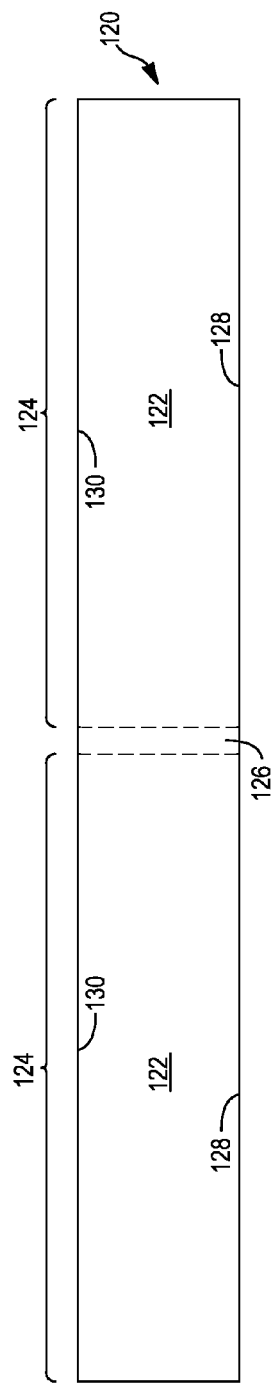

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Figure 2C:
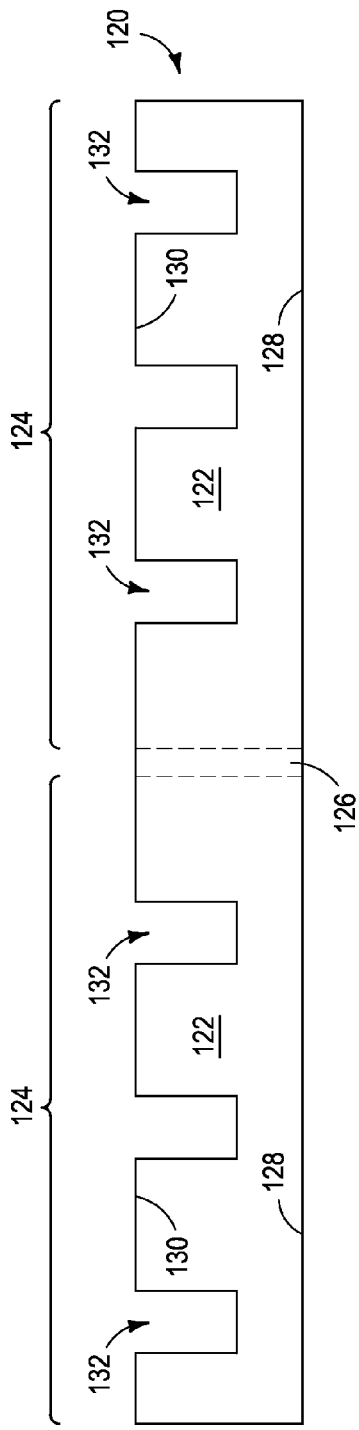

In FIG. 2c, a plurality of vias or blind vias 132 is formed into active surface 130 and partially but not completely through semiconductor wafer 120 using mechanical drilling, laser drilling, or deep reactive ion etching (DRIE).

Figure 2D:
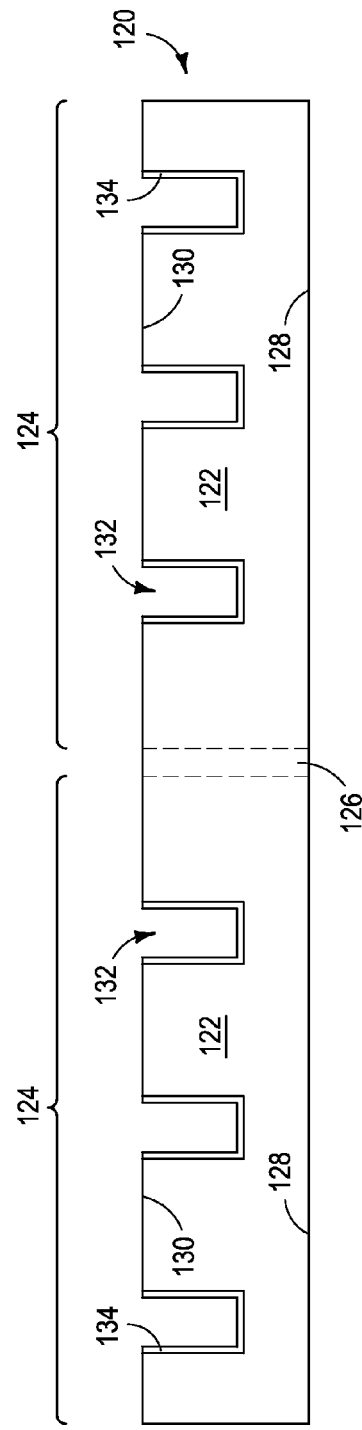

In FIG. 2d, an insulating or dielectric layer 134 is formed within vias 132 over sidewalls of vias 132 using PVD, CVD, printing, spin coating, spray coating, sintering or thermal oxidation. Insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide (Al2O3), or other suitable dielectric material. In one embodiment, insulating layer 134 includes a liner oxide.

In FIG. 2e, vias 132 are filled with an electrically conductive material to form a plurality of conductive through-silicon-vias (TSV) or conductive vias 136. Conductive vias 136 can be one or more layers of aluminum (Al), copper (Cu), tin (Sn), nickel (Ni), gold (Au), silver (Ag), titanium (Ti), tungsten (W), poly-silicon, or other suitable electrically conductive material using electrolytic plating, electroless plating process, or other suitable metal deposition process. Conductive vias 136 provide z-direction interconnect through semiconductor die 124. Conductive vias 136 are lined with insulating layer 134 and embedded within semiconductor wafer 120. In one embodiment, insulating layer 134 operates as a barrier layer to inhibit diffusion of conductive vias 136, e.g., Cu, into base substrate material 122. Conductive vias 136 are electrically connected to the circuits on active surface 130.

In FIG. 2f, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, as shown in FIG. 2c, using a test probe head 140 including a plurality of probes or test leads 142, or other testing device. Probes 142 are used to make electrical contact with nodes or conductive layer 134 on each semiconductor die 124 and provide electrical stimuli to contact pads 132. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
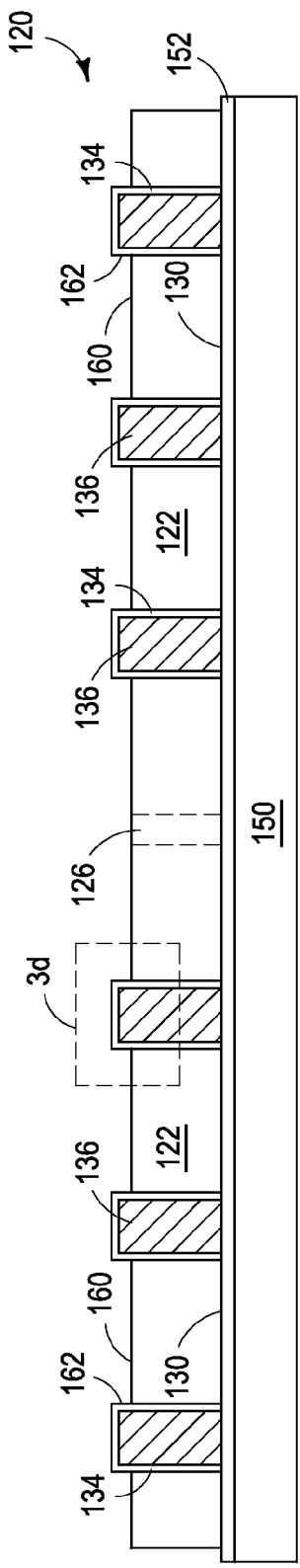

FIGS. 3a-3m, illustrate, in relation to FIGS. 1 and 2a-2f, a process of revealing conductive vias including an organic passivation layer. FIG. 3a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer. Semiconductor wafer 120 including semiconductor die 124 from FIG. 2f are mounted to interface layer 152 over carrier 150 with active surface 130 oriented toward the carrier. Semiconductor wafer 120 is inverted and positioned over interface layer 152 and carrier 150.

In FIG. 3b, a portion of semiconductor wafer 120 is removed from back surface 128 by CMP, backgrinding with grinder 156, or an etching process to expose conductive vias 136 through a BVR process. In one embodiment, the BVR process is completed using CMP of back surface 128 using chemical slurries in combination with mechanical, physical-contact etching. The CMP process gradually removes base substrate material 122 from back surface 128 to reveal or expose conductive vias 136 without damaging other portions of semiconductor wafer 120, i.e., without over etching or under etching the semiconductor material. The BVR process forms a planar backside surface 158. After the BVR process is complete, a thickness of semiconductor wafer 120 is reduced by the BVR process and planar backside surface 158 of semiconductor wafer 120 is exposed.

In FIG. 3c, a portion of semiconductor wafer 120 is removed from planar backside surface 158 by a combination of backgrinding, CMP, and/or etching processes to expose conductive vias 136 and a new back surface 160 of semiconductor wafer 120. Conductive vias 136 remain lined with insulating layer 134 and extend above surface 160 of semiconductor wafer 120. A portion of sidewalls or side surfaces 162 of conductive vias 136 surrounded by insulating layer 134 is exposed from base substrate material 122. Conductive vias 136 extend above surface 160 of base substrate material 122, and base substrate material 122 is recessed with respect to conductive vias 136.

Figure 3D:
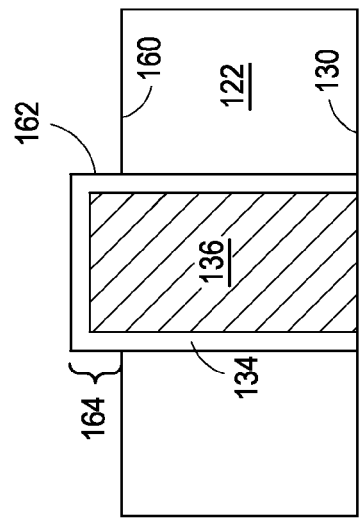

FIG. 3d shows the structure of FIG. 3c in greater detail. A portion 164 of conductive vias 136 and insulating layer 134 extend above surface 160 of semiconductor wafer 120. Insulating layer 134 remains over conductive vias 136 and covers the exposed portion of conductive vias 136. Portion 164 of side surfaces 162 of conductive vias 136 and insulating layer 134 extends above surface 160 of semiconductor wafer 120.

Figure 3E:
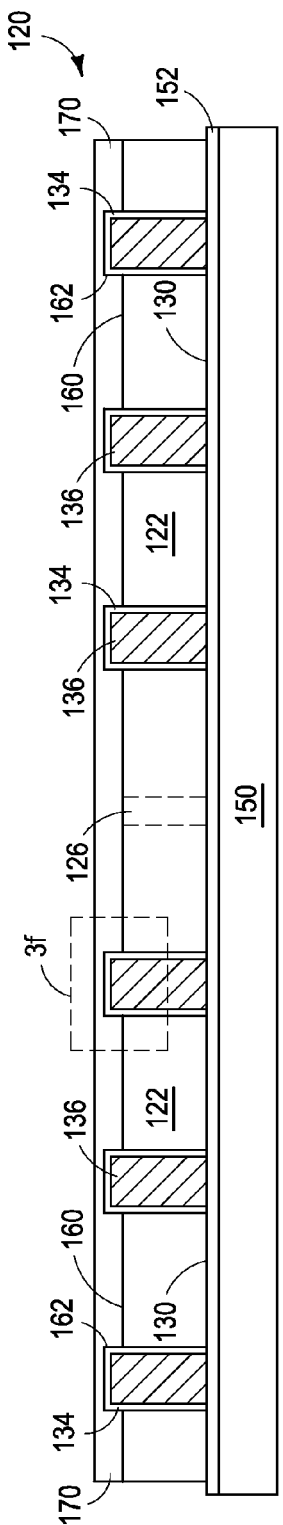

In FIG. 3e, an insulating or passivation layer 170 is formed over surface 160 of semiconductor wafer 120 and over conductive vias 136 using PVD, CVD, printing, spin coating, spray coating, sintering or thermal oxidation. Insulating layer 170 contains one or more layers of SiO2, Si3N4, SiON, Ta2O5, Al2O3, hafnium oxide (HfO2), benzocyclobutene (BCB), polyimide (PI), polybenzoxazoles (PBO), or other material having similar insulating and structural properties. In one embodiment, insulating layer 170 is an organic passivation layer. Insulating layer 170 covers surface 160 of semiconductor wafer 120 and side surfaces 162 of conductive vias 136 with insulating layer 134.

Figure 3F:
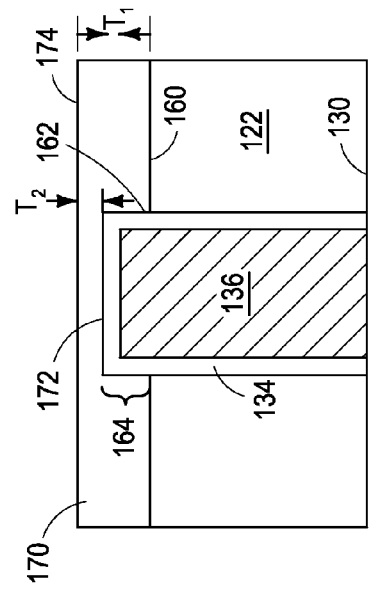

FIG. 3f shows the structure of FIG. 3e in greater detail. Insulating layer 170 is disposed over conductive vias 136. Portion 164 of conductive vias 136 and insulating layer 134 are covered by insulating layer 170. Insulating layer 170 is disposed over surface 160 of base semiconductor material 122, over surface 172 of insulating layer 134, and over conductive vias 136. Insulating layer 170 includes planar surface 174 over semiconductor wafer 120 and conductive vias 136. Insulating layer 170 includes a thickness $T_1$ over surface 160 of semiconductor wafer 120 and a thickness $T_2$ over conductive vias 136. In one embodiment, thickness $T_1$ is greater than thickness 12. The non-uniform thickness of insulating layer 170 over surface 160 and conductive vias 136 forms planar surface 174 over semiconductor wafer 120. In another embodiment, insulating layer 170 is formed with a uniform thickness conformally over semiconductor wafer 120 and follows the contour of surface 160 and conductive vias 136.

In FIG. 3g, a portion of insulating layer 170 is removed from back surface 174 by CMP, backgrinding with grinder 176, or an etching process to expose conductive vias 136 through a BVR process. In one embodiment, the BVR process is completed using CMP of back surface 174 using chemical slurries in combination with mechanical, physical-contact etching. The CMP process gradually removes insulating layer 170 from surface 174 to reveal or expose conductive vias 136 without damaging other portions of semiconductor wafer 120. Alternatively, insulating layer 170 is removed by an etching process, photolithography, or laser direct ablation (LDA) to expose conductive vias 136. The BVR process forms a planar backside surface 178 and reveals conductive vias 136 through insulating layers 134 and 170. A portion of conductive vias 136 may be removed during the BVR process. After the BVR process is complete, conductive vias 136 and planar backside surface 178 of insulating layer 170 are exposed. A thickness of insulating layer 170 is reduced by the BVR process.

FIG. 3h shows the structure of FIG. 3g in greater detail. After the BVR process is complete, surface 190 of conductive vias 136 and surface 192 of insulating layer 134 are exposed from insulating layer 170. Surface 178 of insulating layer 170, surface 190 of conductive TSV 136, and surface 192 of insulating layer 134 are coplanar after the BVR process. Portion 194 of conductive vias 136 extends above base substrate material 122 and is surrounded on a side surface by insulating layers 134 and 170.

Figure 3I:
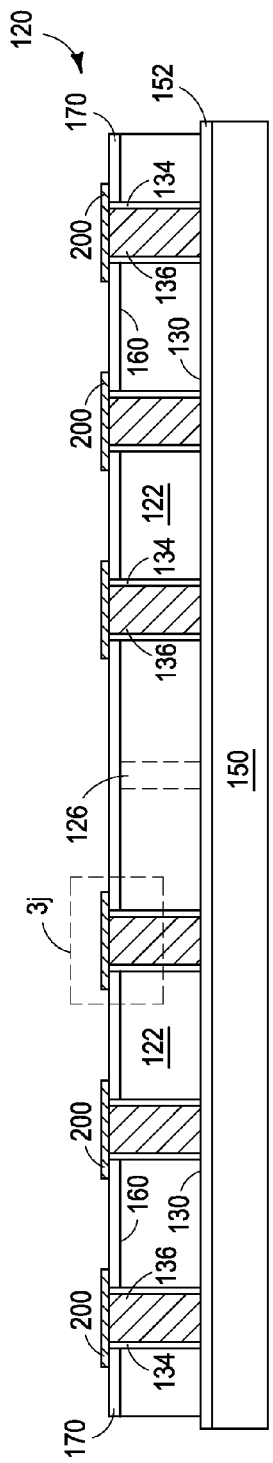

In FIG. 3i, an electrically conductive layer 200 is formed over insulating layers 134 and 170 and over conductive vias 136 using printing, PVD, CVD, sputtering, evaporation, electrolytic plating, electroless plating, or other suitable metal deposition process. Conductive layer 200 can be one or more layers of Al, Cu, Sn, Ni, Au, Ag, Ti, W, titanium tungsten (TiW), titanium copper (TiCu), titanium tungsten copper (TiWCu), tantalum nitrogen copper (TaNCu), or other suitable material. Conductive layer 200 directly contacts the exposed portion of conductive vias 136. Conductive layer 200 operates as an under bump metallization (UBM) electrically connected to conductive vias 136. Conductive layer 200 can be a multi-metal stack with adhesion layer, barrier layer, and seed or wetting layer. The adhesion layer is formed over conductive vias 136 and can be Ti, titanium nitride (TiN), TiW, Al, or chromium (Cr). The barrier layer is formed over the adhesion layer and can be Ni, tantalum nitride (TaN), nickel vanadium (NiV), platinum (Pt), palladium (Pd), TiW, Ti, chromium copper (CrCu), or other suitable barrier material. The barrier layer inhibits the diffusion of Cu into the active area of the die. The seed layer is formed over the barrier layer and can be Cu, Ni, NiV, Au, or Al. Conductive layer 200 provides a low resistive interconnect to conductive vias 136, as well as a barrier to solder diffusion and seed layer for solder wettability.

Figure 3J:
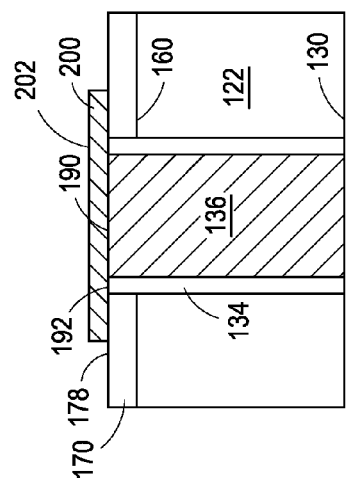

FIG. 3j shows the structure of FIG. 3i in greater detail. Conductive layer 200 is formed over conductive vias 136 and insulating layers 134 and 170. Because insulating layers 134 and 170 and conductive vias 136 are coplanar, conductive layer 200 is formed substantially planar. A surface 202 of conductive layer 200 opposite semiconductor wafer 120 is planar. In one embodiment, conductive layer 200 is formed conformally over the entire surface 160 of semiconductor wafer 120, and portions of conductive layer 200 over insulating layer 170 are subsequently removed by etching or other suitable process.

Figure 3K:
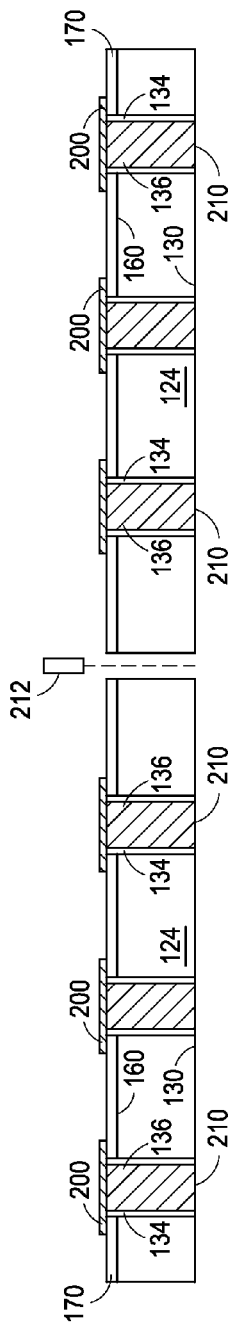

In FIG. 3k, carrier 150 and interface layer 152 are removed by chemical etching, mechanical peeling, CMP, mechanical grinding, thermal bake, UV light, laser scanning, or wet stripping to expose active surface 130 of semiconductor wafer 120. After carrier 150 and interface layer 152 are removed, active surface 130 of semiconductor die 124 and surface 210 of conductive vias 136 are exposed.

Semiconductor wafer 120 is singulated through saw street 126 using a saw blade or laser cutting tool 212 into individual semiconductor die 124. Semiconductor die 124 is electrically connected to conductive layer 200 through conductive vias 136. The individual semiconductor die 124 can be inspected and electrically tested for identification of KGD post singulation.

Figure 3L:
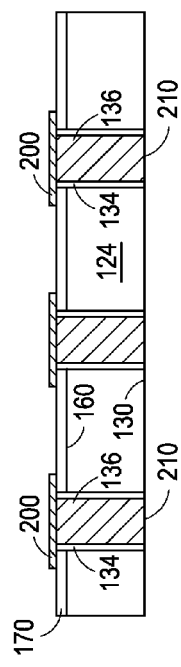

FIG. 3l shows semiconductor die 124 after singulation. Semiconductor die 124 includes conductive vias 136 extending completely through semiconductor die 124 extending from active surface 130 to surface 160. Conductive vias 136 extend beyond surface 160 and through insulating layer 170. Conductive vias 136 are surrounded by insulating layer 134 formed over a sidewall of conductive vias 136. Surface 210 of conductive vias 136 is exposed at active surface 130 of semiconductor die 124. Conductive layer 200 is electrically connected to conductive vias 136. Conductive vias 136 route electrical signals through semiconductor die 124. Conductive vias 136 provide vertical electrical interconnection from active surface 130 of semiconductor die 124 to external devices, for example a PCB. Semiconductor die 124 can be further processed into many types of semiconductor packages, including eWLB, WLCSP, reconstituted or embedded wafer level chip scale packages (eWLCSP), fan-out WLCSP, flipchip packages, 3D packages, package-on-package (PoP), or other semiconductor packages.

The BVR process for revealing conductive vias 136 includes fewer steps than current via reveal processes. In particular the process of forming and revealing conductive vias 136 is accomplished with fewer etching and passivation steps and without photolithography. For example, a portion of insulating layer 170 is removed by CMP rather than photolithography. Additionally, the step of an inorganic passivation layer over semiconductor wafer 120 is eliminated. Use of an organic insulating material, rather than an inorganic insulating material, for insulating layer 170 reduces the residual stress on the semiconductor device to less than 50 Megapascals (MPa) of tensile stress. Therefore, semiconductor die 124 is produced more cost-effectively without the expensive process of additional photolithography and passivation steps and with improved stress performance. Elimination of passivation and photolithography steps reduces the cost of manufacturing semiconductor die 124 including conductive vias 136.

Figure 3M:
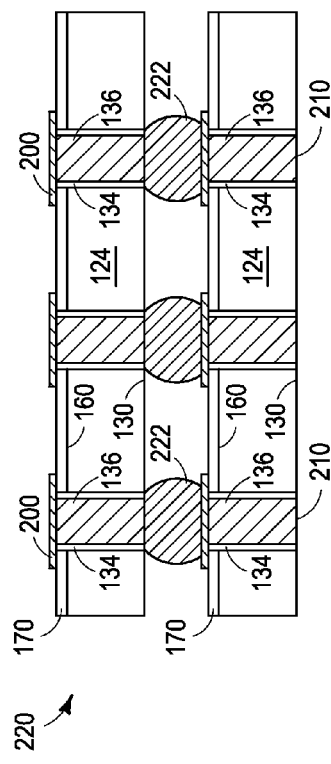

FIG. 3m shows semiconductor package 220 formed by stacking two or more semiconductor die 124. An electrically conductive bump material is deposited over conductive layer 200 or conductive vias 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 200 using a suitable attachment or bonding process. In one embodiment, the bump material is reflowed by heating the material above its melting point to form balls or bumps 222. In some applications, bumps 222 are reflowed a second time to improve electrical contact to conductive layer 200 and conductive vias 136. In one embodiment, bumps 222 are formed over a UBM layer. Bumps 222 can also be compression bonded or thermocompression bonded to conductive layer 200 or conductive vias 136. Bumps 222 represent one type of interconnect structure that can be formed over conductive layer 200 or conductive vias 136. The interconnect structure can also use bond wires, conductive paste, stud bump, micro bump, or other electrical interconnect.

The stacked semiconductor die 124 are electrically connected through bumps 222. Additional interconnect structures, similar to bumps 222, are formed over conductive vias 136 and conductive layer 200 to provide electrical interconnect to external devices. The circuits on active surface 130 of a first semiconductor die 124 are electrically connected through conductive vias 136 and bumps 222 to the circuits on active surface 130 of a second semiconductor die 124.

Figure 4B:
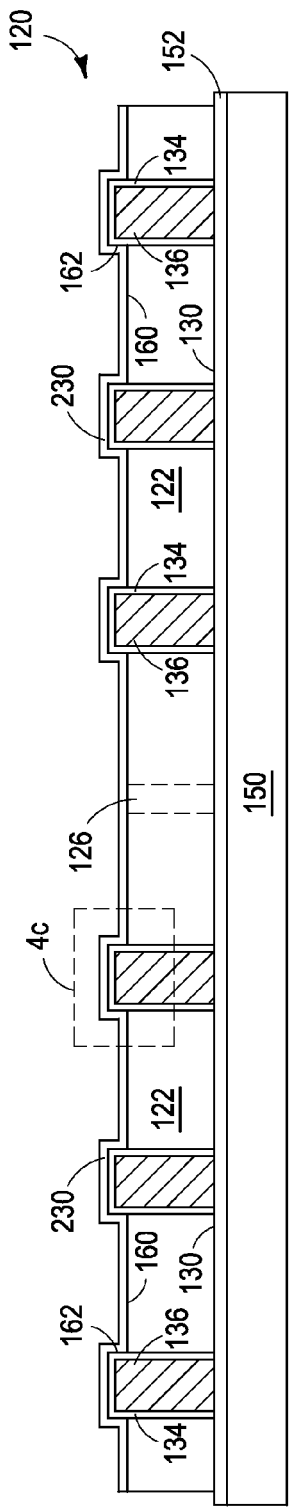

FIGS. 4a-4l illustrate, in relation to FIGS. 1 and 2a-2f, a process of revealing conductive vias including organic and inorganic passivation. Continuing from FIG. 3c, FIG. 4a shows a semiconductor wafer 120 after a portion of back surface 128 of semiconductor wafer 120 is removed. Semiconductor wafer 120 includes conductive vias 136 formed through base substrate material 122. Base substrate material 122 is recessed with respect to conductive vias 136. Insulating layer 134 is formed around conductive vias 136. A portion of sidewalls or side surfaces 162 of conductive vias 136 surrounded by insulating layer 134 is exposed from base substrate material 122. Semiconductor wafer 120 including semiconductor die 124 from FIG. 2f are mounted to interface layer 152 over carrier 150 with active surface 130 oriented toward the carrier. Semiconductor wafer 120 is inverted and positioned over interface layer 152 and carrier 150. Side surfaces 162 of conductive vias 136 and insulating layer 134 are exposed from base substrate material 122 by the BVR process.

In FIG. 4b, an insulating or passivation layer 230 is formed over semiconductor wafer 120 and conductive vias 136 using PVD, CVD, printing, lamination, spin coating, or spray coating. Insulating layer 230 contains one or more layers of SiO2, Si3N4, SiON, Ta2O5, Al2O3, HfO2, BCB, PI, PBO, solder resist, or other material having similar insulating and structural properties. In one embodiment, insulating layer 230 includes an inorganic insulating material or inorganic passivation material. Insulating layer 230 covers surface 160 of semiconductor wafer 120 and side surfaces 162 of conductive vias 136 and insulating layer 134.

Figure 4C:
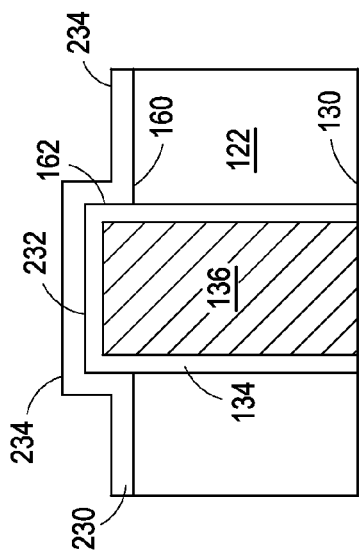

FIG. 4c shows the structure of FIG. 4b in greater detail. Insulating layer 230 is formed conformally over surface 160 of semiconductor wafer 120 and over conductive vias 136. Insulating layer 230 is formed in direct contact with insulating layer 134 over side surfaces 162 and an upper surface 232 of insulating layer 134. In one embodiment, insulating layer 230 is formed with a uniform thickness over surfaces 160, 162, and 232. Insulating layer 230 is non-planar over semiconductor wafer 120 and follows the contour of the protruding conductive vias 136 and the recessed surface 160 of semiconductor wafer 120. Non-planar surface 234 of insulating layer 230 follows the contour of surface 160, side surfaces 162, and surface 232 of insulating layer 134.

Figure 4D:
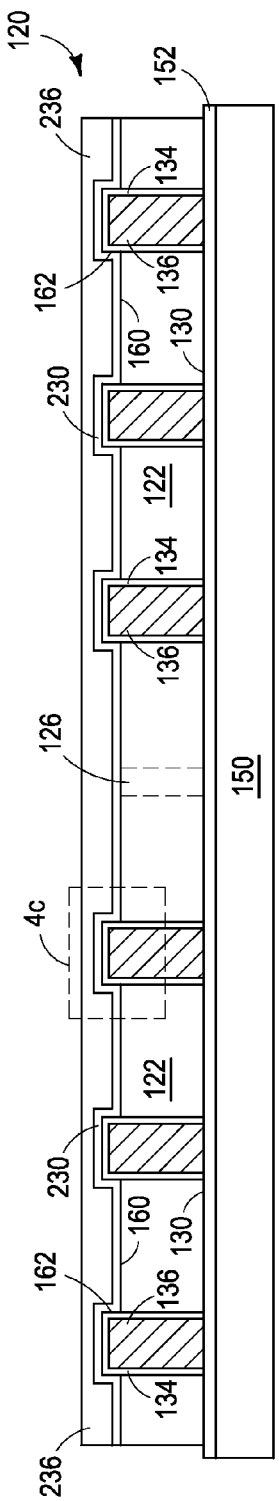

In FIG. 4d, an insulating or passivation layer 236 is formed over insulating layer 230 using PVD, CVD, printing, lamination, spin coating, or spray coating. Insulating layer 236 contains one or more layers of SiO2, Si3N4, SiON, Ta2O5, Al2O3, HfO2, BCB, PI, PBO, solder resist, or other material having similar insulating and structural properties. In one embodiment, insulating layer 236 includes an organic insulating material or organic passivation material. Insulating layer 236 is disposed over surface 160 semiconductor wafer 120 and side surfaces 162 of conductive vias 136 and insulating layer 134.

Figure 4E:
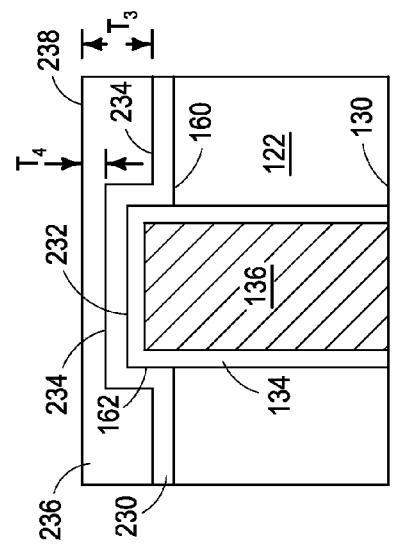

FIG. 4e shows the structure of FIG. 4d in greater detail. Insulating layer 236 is formed with planar surface 238 and covers the entire surface 160 semiconductor wafer 120. In one embodiment, insulating layer 236 includes a non-uniform thickness. Insulating layer 236 includes a thickness $T_3$ over surface 160 of semiconductor wafer 120 and a thickness $T_4$ over conductive vias 136 and surface 234 of insulating layer 230. In one embodiment, thickness $T_3$ is greater than thickness $T_4$. The non-uniform thickness of insulating layer 236 over surface 160 and conductive vias 136 forms planar surface 238 over semiconductor wafer 120. In another embodiment, insulating layer 236 is formed with a uniform thickness conformally over semiconductor wafer 120 and follows the contour of surface 234 of insulating layer 230.

Figure 4F:
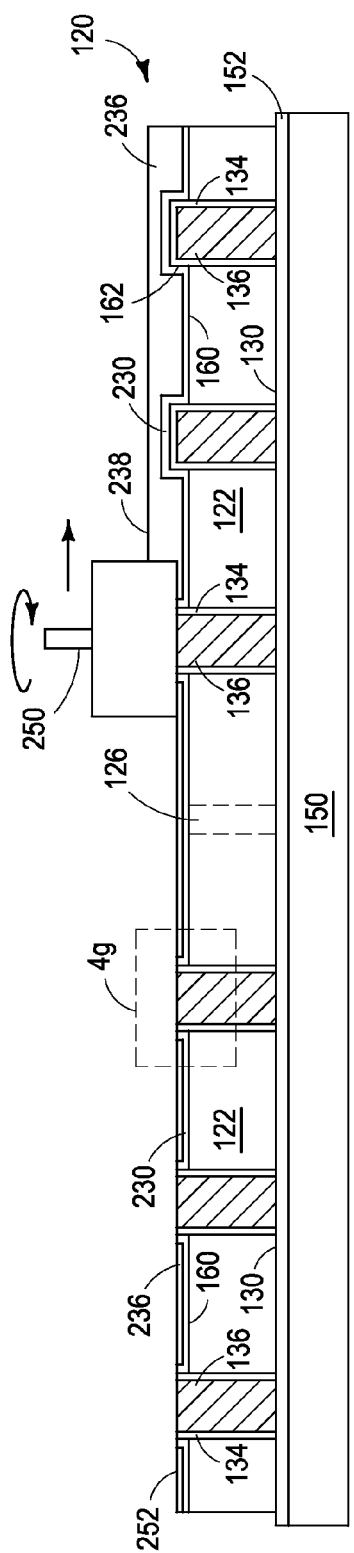

In FIG. 4f, a portion of semiconductor wafer 120 is removed by CMP, backgrinding with grinder 250, or an etching process to expose conductive vias 136 through a BVR process. In one embodiment, the BVR process is completed using CMP of insulating layers 134, 230, and 236 using chemical slurries in combination with mechanical, physical-contact etching. The CMP process gradually removes a portion of insulating layer 236 from surface 238, and a portion of insulating layers 134 and 230 to reveal or expose conductive vias 136. A portion of conductive vias 136 may be removed during the BVR process. The BVR process forms a planar backside surface 252 and reveals conductive vias 136 through insulating layers 134, 230, and 236. After the BVR process is complete, conductive vias 136 and planar backside surface 252 of insulating layer 236 are exposed. A thickness of insulating layer 236 is reduced by the BVR process.

Figure 4G:
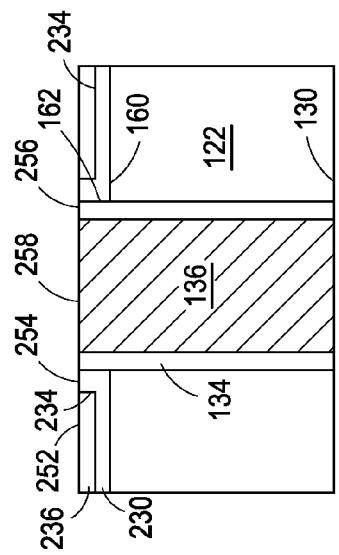

FIG. 4g shows the structure of FIG. 4f in greater detail. The BVR process forms a planar backside surface 252 and reveals conductive vias 136 through insulating layers 134, 230, and 236. Surface 254 of insulating layer 230, surface 256 of insulating layer 134, and surface 258 of conductive vias 136 are exposed. After the CMP process is complete, insulating layers 236, 230, and 134 are coplanar with conductive vias 136. Surface 252 of insulating layer 236, surface 254 of insulating layer 230, and surface 256 of insulating layer 134 are coplanar with surface 258 of conductive vias 136. A portion of conductive vias 136 extends above base substrate material 122 and is surrounded on a side surface by insulating layers 134, 230, and 236.

Figure 4H:
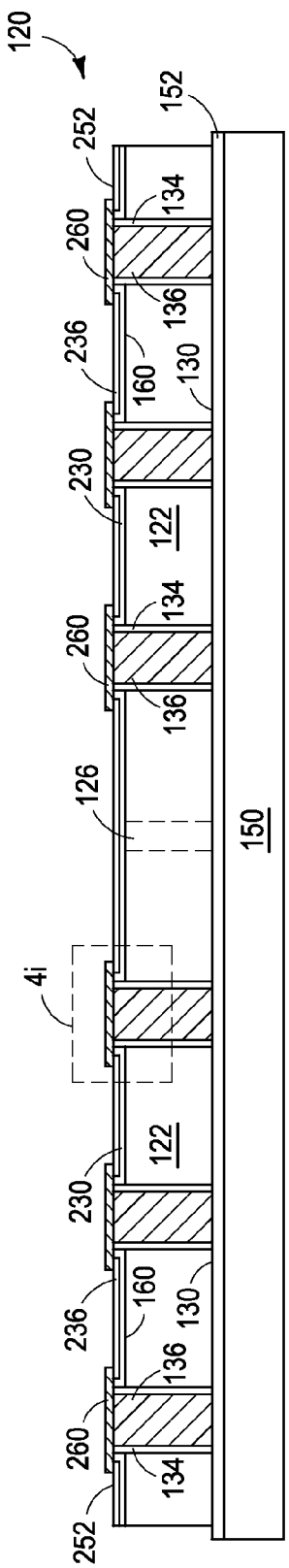

In FIG. 4h, an electrically conductive layer 260 is formed over insulating layer 236 and conductive vias 136 using printing, PVD, CVD, sputtering, evaporation, electrolytic plating, electroless plating, or other suitable metal deposition process. Conductive layer 260 can be one or more layers of Al, Cu, Sn, Ni, Au, Ag, Ti, W, TiW, TiCu, TiWCu, TaNCu, or other suitable material. Conductive layer 260 directly contacts the exposed portion of conductive vias 136. Conductive layer 260 operates as a UBM electrically connected to conductive vias 136. Conductive layer 260 can be a multi-metal stack with adhesion layer, barrier layer, and seed or wetting layer. The adhesion layer is formed over conductive vias 136 and can be Ti, TiN, TiW, Al, or Cr. The barrier layer is formed over the adhesion layer and can be Ni, TaN, NiV, Pt, Pd, TiW, Ti, CrCu, or other suitable barrier material. The barrier layer inhibits the diffusion of Cu into the active area of the die. The seed layer is formed over the barrier layer and can be Cu, Ni, NiV, Au, or Al. Conductive layer 260 provides a low resistive interconnect to conductive vias 136, as well as a barrier to solder diffusion and seed layer for solder wettability.

Figure 4I:
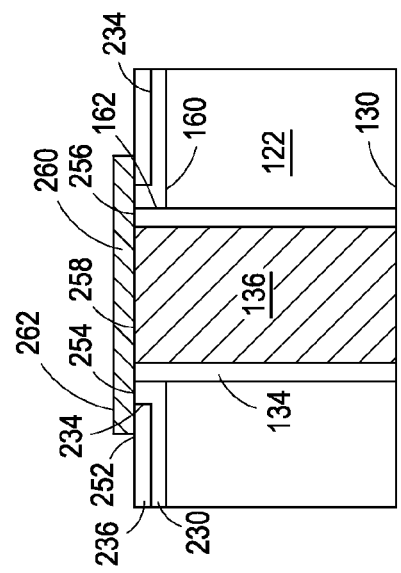

FIG. 4i shows the structure of FIG. 4h in greater detail. Conductive layer 260 is formed over insulating layers 236, 230, and 134 and over conductive vias 136. Because the surfaces of insulating layers 134, 230, and 236 and conductive vias 136 are coplanar, conductive layer 260 is formed substantially planar. A surface 262 of conductive layer 260 opposite semiconductor wafer 120 is planar. In one embodiment, conductive layer 260 is formed over the entire surface 252 of semiconductor wafer 120, and portions of conductive layer 260 are subsequently removed by etching or other suitable process. Conductive layer 260 directly contacts surface 252 of insulating layer 236, surface 254 of insulating layer 230, surface 256 of insulating layer 134, and surface 258 of conductive vias 136. Conductive layer 260 is substantially planar over semiconductor wafer 120 and conductive vias 136.

Figure 4J:
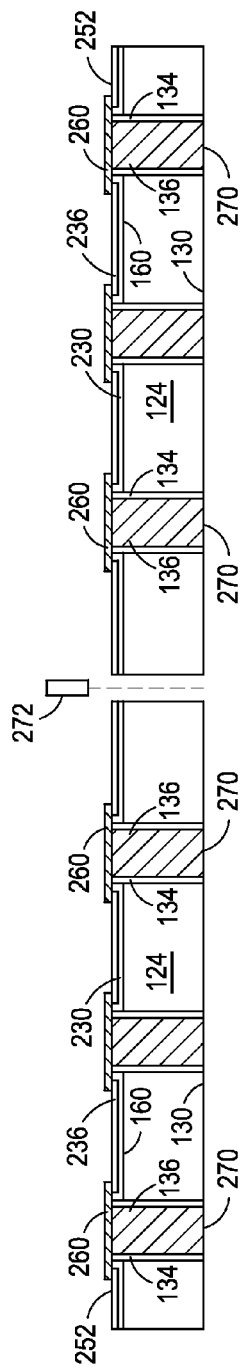

In FIG. 4j, carrier 150 and interface layer 152 are removed by chemical etching, mechanical peeling, CMP, mechanical grinding, thermal bake, UV light, laser scanning, or wet stripping to expose active surface 130 of semiconductor wafer 120. After carrier 150 and interface layer 152 are removed, active surface 130 of semiconductor die 124 and surface 270 of conductive vias 136 are exposed.

Semiconductor wafer 120 is singulated through saw street 126 using a saw blade or laser cutting tool 272 into individual semiconductor die 124. Semiconductor die 124 is electrically connected to conductive layer 260 through conductive vias 136. The individual semiconductor die 124 can be inspected and electrically tested for identification of KGD post singulation. Semiconductor die 124 may undergo electrical testing before or after singulation.

Figure 4K:
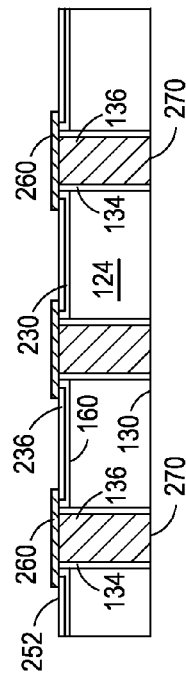

FIG. 4k shows semiconductor die 124 after singulation. Semiconductor die 124 includes conductive vias 136 extending completely through semiconductor die 124 extending from active surface 130 to surface 160. Conductive vias 136 extend beyond surface 160 and through insulating layers 230 and 236. Conductive vias 136 are surrounded by insulating layer 134 formed over a sidewall of conductive vias 136. Conductive vias 136 extend beyond surface 160 of semiconductor die 124. Surface 270 of conductive vias 136 is exposed at active surface 130 of semiconductor die 124. Conductive layer 260 is electrically connected to conductive vias 136. Conductive vias 136 route electrical signals through semiconductor die 124. Conductive vias 136 provide vertical electrical interconnection from active surface 130 of semiconductor die 124 to external devices, for example a PCB. Semiconductor die 124 can be further processed into many types of semiconductor packages, including eWLB, WLCSP, reconstituted or embedded wafer level chip scale packages (eWLCSP), fan-out WLCSP, flip-chip packages, 3D packages, package-on-package (PoP), or other semiconductor packages.

The BVR process for revealing conductive vias 136 includes fewer steps than current via reveal processes. In particular the process of forming and revealing conductive vias 136 is accomplished with fewer steps and without photolithography. For example, portions of insulating layers 230 and 236 are removed by CMP rather than photolithography. Therefore, semiconductor die 124 is produced more cost-effectively without the expensive process of photolithography. Further, the use of an organic insulating material, such as insulating layer 236, reduces the residual stress on the inorganic insulating material, such as insulating layer 230, and reduces the overall stress on the semiconductor device. Insulating layer 236, which includes organic insulating material, therefore improves the stress performance of the semiconductor device. Elimination of photolithography reduces the cost of manufacturing semiconductor die 124 including conductive vias 136.

Figure 4L:
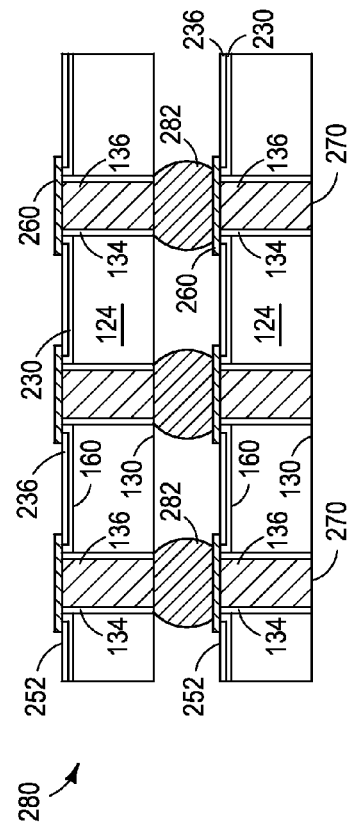

FIG. 4l shows semiconductor package 280 formed by stacking two or more semiconductor die 124. An electrically conductive bump material is deposited over conductive layer 260 or conductive vias 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 260 using a suitable attachment or bonding process. In one embodiment, the bump material is reflowed by heating the material above its melting point to form balls or bumps 282. In some applications, bumps 282 are reflowed a second time to improve electrical contact to conductive layer 260 and conductive vias 136. In one embodiment, bumps 282 are formed over a UBM layer. Bumps 282 can also be compression bonded or thermocompression bonded to conductive layer 260 or conductive vias 136. Bumps 282 represent one type of interconnect structure that can be formed over conductive layer 260 or conductive vias 136. The interconnect structure can also use bond wires, conductive paste, stud bump, micro bump, or other electrical interconnect.

The stacked semiconductor die 124 are electrically connected through bumps 282. Additional interconnect structures, similar to bumps 282, are formed over conductive vias 136 and conductive layer 260 to provide electrical interconnect to external devices. The circuits on active surface 130 of a first semiconductor die 124 are electrically connected through conductive vias 136 and bumps 282 to the circuits on active surface 130 of a second semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer;
   forming a plurality of openings in the semiconductor wafer;
   forming a plurality of conductive vias in the plurality of openings in the semiconductor wafer, respectively;
   removing a portion of the semiconductor wafer to leave a respective portion of each conductive via of the plurality of conductive vias extending above the semiconductor wafer;
   forming a first insulating layer over the plurality of conductive vias and semiconductor wafer, wherein the first insulating layer includes a first planar top surface that extends uniformly across an entire surface of the semiconductor wafer;
   planarizing the first insulating layer and the plurality of conductive vias together to form a second planar top surface of the first insulating layer, wherein the second planar top surface of the first insulating layer extends as a uniform plane to each respective conductive via of the plurality of conductive vias;
   forming a conductive layer over the plurality of conductive vias and the second planar top surface of the first insulating layer, wherein a surface of the conductive layer opposite the semiconductor wafer is planar across an entire width of the conductive layer and the conductive layer extends outside a footprint of each respective opening of the plurality of openings in the semiconductor wafer to contact the second planar top surface of the first insulating layer, and wherein the second planar top surface of the first insulating layer is exposed between portions of the conductive layer;

singulating the semiconductor wafer into a plurality of semiconductor die, wherein a first semiconductor die of the plurality of semiconductor die includes a first conductive via of the plurality of conductive vias and a second semiconductor die of the plurality of semiconductor die includes a second conductive via of the plurality of conductive vias; and disposing the first semiconductor die of the plurality of semiconductor die over the second semiconductor die of the plurality of semiconductor die, wherein a conductive bump is in direct physical contact with the first conductive via of the plurality of conductive vias of the first semiconductor die of the plurality of semiconductor die and a first portion of the conductive layer on the second semiconductor die of the plurality of semiconductor die.

2. The method of claim 1, further comprising:
forming a second insulating layer over the plurality of conductive vias and semiconductor wafer;
forming the first insulating layer over the second insulating layer; and
planarizing a portion of the second insulating layer with the first insulating layer and plurality of conductive vias.

3. A method of making a semiconductor device, comprising:
providing a semiconductor wafer;
forming a first conductive via and a second conductive via into the semiconductor wafer;
forming a first insulating layer over the semiconductor wafer and covering the first conductive via and second conductive via, wherein the first insulating layer includes a first planar top surface that extends uniformly across an entire width of the semiconductor wafer;
planarizing the first conductive via, second conductive via, and first insulating layer to form a second planar top surface of the first insulating layer;
forming a first conductive layer over the first conductive via, second conductive via, and first insulating layer, wherein a surface of the first conductive layer is planar across an entire width of the first conductive layer, the first conductive layer overlaps and contacts the second planar top surface of the first insulating layer, and the second planar top surface extends outside a footprint of the first conductive layer;
singulating the semiconductor wafer into a plurality of semiconductor die, wherein a first semiconductor die of the plurality of semiconductor die includes the first conductive via and a second semiconductor die of the plurality of semiconductor die includes the second conductive via; and
disposing the first semiconductor die of the plurality of semiconductor die over the second semiconductor die of the plurality of semiconductor die, wherein a conductive bump is in direct physical contact with the first conductive via and a portion of the first conductive layer on the second semiconductor die of the plurality of semiconductor die.

4. The method of claim 3, further comprising:
forming a second insulating layer over the semiconductor wafer, first conductive via, and second conductive via;
planarizing the first conductive via, second conductive via, first insulating layer, and second insulating layer; and
wherein forming the first conductive layer includes forming the first conductive layer to contact a top surface of the second insulating layer.

5. The method of claim 4, further comprising planarizing the first conductive via, second conductive via, first insulating layer, and second insulating layer by chemical mechanical polishing.

6. The method of claim 3, wherein forming the first conductive via comprises:
forming an opening in the semiconductor wafer;
forming a second insulating layer within the opening; and
forming a second conductive layer within the opening after forming the second insulating layer.

7. The method of claim 3, further comprising:
forming a second insulating layer over the first insulating layer; and
forming the first conductive layer over and contacting the second insulating layer.

8. The method of claim 3, wherein the first insulating layer includes an organic material.

9. A method of making a semiconductor device, comprising:
providing a semiconductor die;
forming a conductive via through the semiconductor die;
removing a portion of the semiconductor die;
forming a first insulating layer over the conductive via and semiconductor die, wherein the first insulating layer includes a first planar top surface that extends uniformly across an entire width of the semiconductor die;
planarizing the first insulating layer from over the conductive via to form a second planar top surface of the first insulating layer; and
forming a first conductive layer over the conductive via and first insulating layer, wherein the first conductive layer contacts a top surface of the first insulating layer and the second planar top surface of the first insulating layer extends outside a footprint of the first conductive layer.

10. The method of claim 9, further comprising:
forming a second insulating layer over the conductive via and semiconductor die; and
planarizing the second insulating layer with the first insulating layer.

11. The method of claim 9, further comprising planarizing the first insulating layer by chemical mechanical polishing.

12. The method of claim 9, wherein the first conductive layer is substantially planar.

13. The method of claim 9, wherein forming the conductive via comprises:
forming an opening in the semiconductor die;
forming a second insulating layer within the opening; and
forming a second conductive layer within the opening.

14. The method of claim 1, wherein forming each respective conductive via of the plurality of conductive vias comprises:
depositing a second insulating layer into each respective opening of the plurality of openings in the semiconductor wafer to coat a bottom and side surface of each respective opening of the plurality of openings in the semiconductor wafer; and
depositing a conductive material into each respective opening of the plurality of openings in the semiconductor wafer after depositing the second insulating layer.

15. The method of claim 14, further comprising planarizing a portion of the second insulating layer with the first insulating layer and each respective conductive via of the plurality of conductive vias.

16. The method of claim 6, wherein planarizing the first conductive via removes a portion of the second insulating layer to expose the second conductive layer.

17. The method of claim 13, further comprising:
   forming the via into a first surface of the semiconductor die and only partially through the semiconductor die; and
   forming the first insulating layer over a second surface of the semiconductor die opposite the first surface of the semiconductor die.

18. The method of claim 1, wherein the conductive bump includes a solder material in direct physical contact with the first conductive via of the plurality of conductive vias of the first semiconductor die of the plurality of semiconductor die and the first portion of the conductive layer on the second semiconductor die of the plurality of semiconductor die.

* * * * *